(12) United States Patent
Uchida et al.

(10) Patent No.: US 7,459,335 B2
(45) Date of Patent: Dec. 2, 2008

(54) SOLID-STATE IMAGING APPARATUS AND METHOD FOR PRODUCING THE SAME

(75) Inventors: Mikiya Uchida, Kyoto (JP); Yoshiyuki Matsunaga, Kamakura (JP); Makoto Inagaki, Muko (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/726,437

(22) Filed: Mar. 22, 2007

(65) Prior Publication Data

US 2007/0184570 A1 Aug. 9, 2007

Related U.S. Application Data

(62) Division of application No. 10/809,215, filed on Mar. 25, 2004, now Pat. No. 7,214,976.

(30) Foreign Application Priority Data

Mar. 31, 2003 (JP) ............................. 2003-096245

(51) Int. Cl.
*H01L 21/00* (2006.01)
(52) U.S. Cl. ............................. 438/73; 438/75; 438/97; 438/98
(58) Field of Classification Search ................... 438/57, 438/59, 63, 69, 73, 75, 80, 90, 93, 97, 98
See application file for complete search history.

(56) References Cited

U.S. PATENT DOCUMENTS

| | | | |
|---|---|---|---|
| 5,625,210 A | 4/1997 | Lee et al. | |
| 6,037,577 A | 3/2000 | Tanaka et al. | |
| 6,306,679 B1 * | 10/2001 | Kang et al. | 438/73 |
| 6,492,668 B2 | 12/2002 | Maeda | |
| 6,737,291 B1 * | 5/2004 | Lim | 438/45 |
| 6,740,915 B1 * | 5/2004 | Rhodes | 257/291 |
| 6,784,013 B2 * | 8/2004 | Rhodes | 438/57 |
| 6,930,337 B2 * | 8/2005 | Rhodes | 257/292 |
| 7,005,312 B2 * | 2/2006 | Lee | 438/29 |
| 7,338,832 B2 * | 3/2008 | Park et al. | 438/57 |
| 2002/0011614 A1 | 1/2002 | Rhodes | |
| 2002/0121656 A1 | 9/2002 | Guidash | |
| 2003/0042488 A1 | 3/2003 | Rhodes | |

(Continued)

FOREIGN PATENT DOCUMENTS

EP    0 605 958    7/1994

(Continued)

*Primary Examiner*—Kevin M Picardat
(74) *Attorney, Agent, or Firm*—Hamre, Schumann, Mueller & Larson, P.C.

(57) ABSTRACT

A solid-state imaging apparatus includes a plurality of photosensitive cells, and a driving unit provided for driving the plurality of photosensitive cells. Each photosensitive cell includes a photodiode formed to be exposed on a surface of a semiconductor substrate for the purpose of accumulating signal charge obtained by subjecting incident light to photoelectric conversion, a transfer transistor for transferring signal charge accumulated by the photodiode, a floating diffusion layer for temporarily accumulating signal charge transferred by the transfer transistor, and an amplifier transistor for amplifying signal charge temporarily accumulated in the floating diffusion layer. A source/drain diffusion layer provided in the amplifier transistor is covered with a salicide layer, and the floating diffusion layer is formed to be exposed on a surface of the semiconductor substrate.

6 Claims, 19 Drawing Sheets

U.S. PATENT DOCUMENTS

| | | |
|---|---|---|
| 2003/0234432 A1 | 12/2003 | Song et al. |
| 2004/0046193 A1 | 3/2004 | Park et al. |
| 2004/0082154 A1 | 4/2004 | Lim |
| 2005/0164440 A1 * | 7/2005 | Yaung et al. ................ 438/197 |

FOREIGN PATENT DOCUMENTS

| | | |
|---|---|---|
| EP | 1 075 028 | 8/2000 |
| EP | 1 139 428 | 10/2001 |
| JP | 10-257389 | 9/1998 |
| JP | 2001-111022 | 4/2001 |
| JP | 2002-190586 | 7/2002 |
| JP | 2002-270808 | 9/2002 |
| JP | 2004-104131 | 4/2004 |

* cited by examiner

US 7,459,335 B2

SOLID-STATE IMAGING APPARATUS AND METHOD FOR PRODUCING THE SAME

This application is a division of U.S. application Ser. No. 10/809,215, filed Mar. 25, 2004, which application is incorporated herein by reference.

BACKGROUND OF THE INVENTION

1. Field of the Invention

The present invention relates to a solid-state imaging apparatus equipped with an area image sensor used for a household video camera, a digital still camera, a camera for a mobile telephone, etc., and a method for producing the solid-state imaging apparatus.

2. Description of the Related Art

FIG. 13 is a circuit diagram showing a configuration of a conventional solid-state imaging apparatus 90. Photosensitive cells 98 composed of photodiodes 95, transfer gates 96, amplifier transistors 92, and reset transistors 97 are arranged in a matrix (3 row×3 column).

Drains of the amplifier transistor 92 and the reset transistor 97 are connected to a common drain line 306. A source of the amplifier transistor 92 is connected to a vertical signal line 15, as shown in FIG. 13. One end of the vertical signal line 15 is connected to a load transistor 305, and the other end thereof is connected to a noise suppressing circuit 12. Outputs of the noise suppressing circuit 12 are connected to horizontal transistors 14 driven by a horizontal driver circuit 13. Each photosensitive cell 98 is driven by a vertical driver circuit 11.

FIG. 14 is plan view showing a configuration of the photosensitive cells 98 provided in the conventional solid-state imaging apparatus 90. A signal of the photodiode 95 is read to a floating diffusion layer 91 through the transfer gate 96. The signal that has been subjected to voltage conversion in the floating diffusion layer 91 is applied from a floating diffusion layer contact 203 to a gate 304 of the amplifier transistor 92. A source/drain of the amplifier transistor 92 is connected to the common drain line 306 and the vertical signal line 15. A signal charge in the floating diffusion layer 91 is discharged to the common drain line 306 through the reset transistor 97.

FIG. 15 is a cross-sectional view along a plane XYZW shown in FIG. 14. The photodiode 95 composed of an n-type photodiode diffusion layer 402 and a p-type leakage blocking layer 403 is formed in a P-type semiconductor substrate 9.

A gate electrode of a MOS transistor constituting the transfer gate 96, the reset transistor 97, and the amplifier transistor 92 has a double-layered structure of a polysilicon layer 406 and a salicide layer 407.

The floating diffusion layer 91 has the salicide layer 407 on a double diffusion layer composed of an LDD diffusion layer 404 and a source/drain diffusion layer 405.

A source/drain of the MOS transistor has the salicide layer 407 on the double diffusion layer composed of the LDD diffusion layer 404 and the source/drain diffusion layer 405. The salicide layer 407 does not transmit light, so that it is removed from an upper portion of the photodiode 95.

FIGS. 16 to 19 are cross-sectional views showing a method for producing the conventional solid-state imaging apparatus 90. As shown in FIG. 16, after a device separating layer 502 is formed on a semiconductor substrate 9, a resist 501 is formed in a predetermined pattern by photoetching, and an n-type photodiode diffusion layer 402 and a p-type leakage blocking layer 403 are formed by ion implanting.

After the resist 501 is removed, a polysilicon layer 406 to be gate electrodes of MOS transistors constituting the transfer gate 96, the reset transistor 97, and the amplifier transistor 92 is formed, as shown in FIG. 17. Thereafter, a salicide blocking film 503 is formed so as to cover the photodiode 95, and then, a LDD diffusion layer 404 is formed so as to be self-aligned with the polysilicon layer 406 by ion implanting.

Then, as shown in FIG. 18, an LDD oxide film 504 is deposited so as to cover the salicide blocking film 503, the polysilicon film 406, and the LDD diffusion layer 404. Then, as shown in FIG. 19, the LDD oxide film 504 is removed by anisotropic etching, whereby parts of the LDD oxide film 504 remain on both sides of the polysilicon layer 406 deposited thick in a vertical direction. A source/drain diffusion layer 405 is formed so as to be self-aligned with the LDD oxide film 504. Thereafter, metal materials such as titanium (Ti), cobalt (Co), etc. are deposited by sputtering, followed by heating. As a result, only the portions where the semiconductor substrate and polysilicon are exposed are salicided, and a salicide layer 407 remains.

In the above-mentioned configuration of the photosensitive cells in the conventional solid-state imaging apparatus, the floating diffusion layer 91 temporarily accumulates a signal of the photodiode 95. At this time, when there is a pn-junction opposite-direction leakage current in the floating diffusion layer 91, the leakage current is superimposed on the signal to generate noise.

The time for signal charge to remain is shorter than that for the photodiode 95 to subject incident light to photoelectric exchange and store it. Therefore, a requirement for a pn-junction opposite-direction leakage current is not so strict as in a photodiode; however, when the floating diffusion layer 91 is produced in the same way as in source/drain of other transistors, a pn-junction opposite-direction leakage current is increased and causes serious noise. When this noise is large, the sensitivity of the solid-state imaging apparatus is decreased to degrade an S/N ratio of a signal, etc.

SUMMARY OF THE INVENTION

Therefore, with the foregoing in mind, it is an object of the present invention to provide a solid-state imaging apparatus having small noise and high sensitivity, and a method for producing the same.

A solid-state imaging apparatus according to the present invention includes a plurality of photosensitive cells disposed in a matrix in a photosensitive region on a semiconductor substrate, and a driving unit for driving the plurality of photosensitive cells. Each of the photosensitive cells includes a photodiode formed to be exposed on a surface of the semiconductor substrate, for accumulating signal charge obtained by subjecting incident light to photoelectric exchange, a transfer transistor formed on the semiconductor substrate for transferring the signal charge accumulated in the photodiode, a floating diffusion layer formed on the semiconductor substrate for temporarily accumulating the signal charge transferred by the transfer transistor, and an amplifier transistor formed on the semiconductor substrate, for amplifying the signal charge temporarily accumulated in the floating diffusion layer. A source/drain diffusion layer provided in the amplifier transistor is covered with a salicide layer, and the floating diffusion layer is formed to be exposed on the surface of the semiconductor substrate.

A method for producing the above-mentioned solid-state imaging apparatus according to the present invention includes forming the photodiode, the transfer transistor, and the amplifier transistor on the semiconductor substrate, forming a resist in a predetermined pattern so as to cover the photodiode, the transfer transistor, and the amplifier transistor, implanting ions into the semiconductor substrate using the resist as a mask so as to form the floating diffusion layer, removing the resist and forming a salicide blocking film so as to cover the floating diffusion layer and the photodiode, forming a source/drain diffusion layer of the amplifier transistor, and forming a salicide layer so as to cover the source/drain diffusion layer of the amplifier transistor.

Another method for producing the above-mentioned solid-state imaging apparatus according to the present invention includes forming a resist in a predetermined pattern on the semiconductor substrate, implanting ions using the resist as a mask so as to form the photodiode, removing the resist and forming the transfer transistor and the amplifier transistor on the semiconductor substrate, forming a first salicide blocking film so as to cover the photodiode, implanting ions into the semiconductor substrate so as to form the floating diffusion layer and the source/drain diffusion layer of the amplifier transistor, forming a second salicide blocking film so as to cover the floating diffusion layer, and forming a salicide layer so as to cover the source/drain diffusion layer of the amplifier transistor.

These and other advantages of the present invention will become apparent to those skilled in the art upon reading and understanding the following detailed description with reference to the accompanying figures.

DESCRIPTION OF THE PREFERRED EMBODIMENTS

Figure 1:
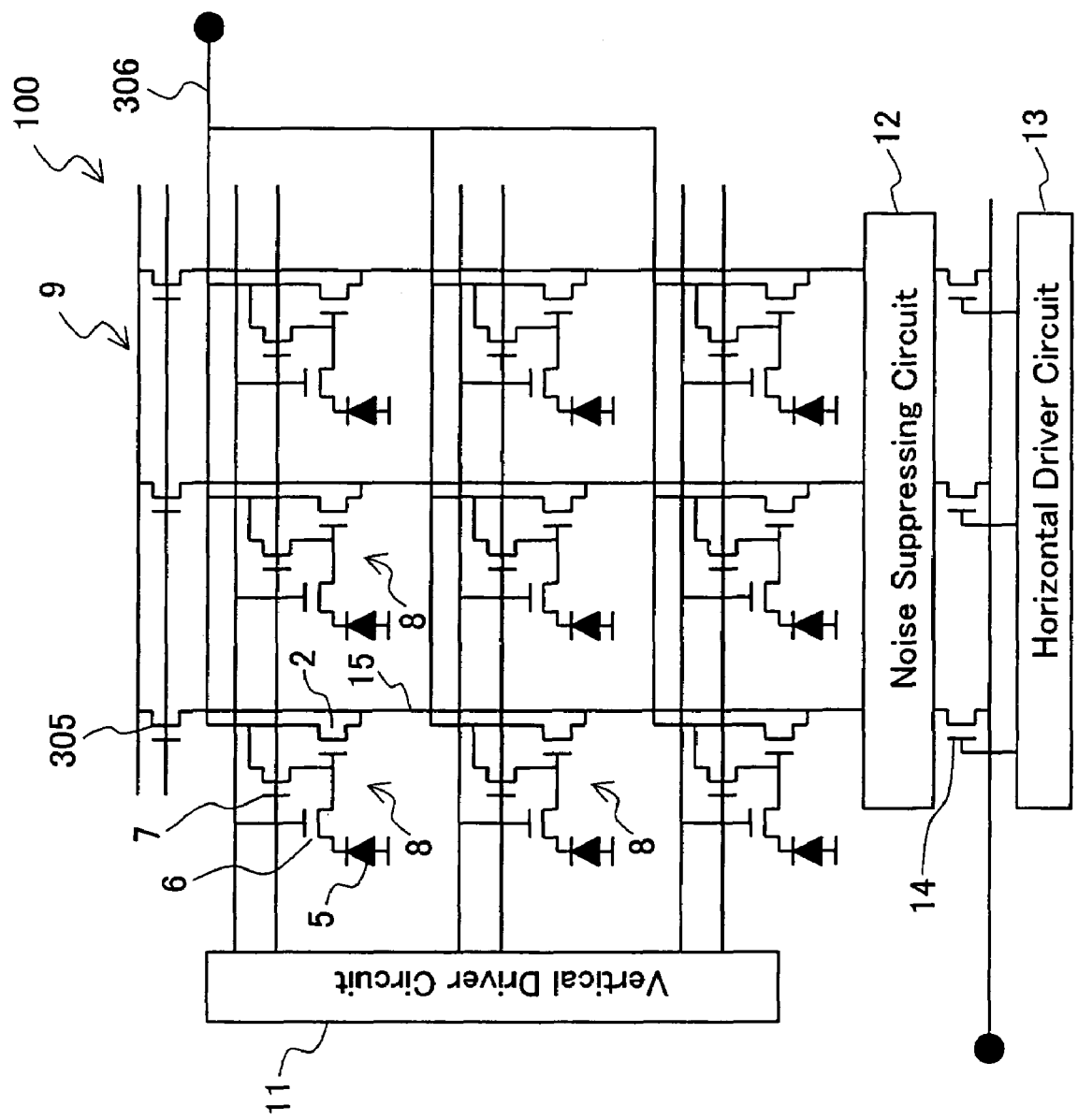
FIG. 1 is a circuit diagram showing a configuration of a solid-state imaging apparatus according to the present embodiment.

In the solid-state imaging apparatus according to the present embodiment, the source/drain diffusion layer provided in the amplifier transistor is covered with a salicide layer, and the floating diffusion layer is formed so as to be exposed on a surface of the semiconductor substrate. Therefore, the salicide layer is not formed on the surface of the floating diffusion layer. Thus, a pn-junction opposite-direction leakage current is reduced in the floating diffusion layer. As a result, a solid-state imaging apparatus with small noise and high sensitivity can be obtained.

In the present embodiment, it is preferable that an impurity concentration of the floating diffusion layer is lower than an impurity concentration of the source/drain diffusion layer of the amplifier transistor.

It is preferable that each of the photosensitive cells further includes a reset transistor for resetting the floating diffusion layer. It also is preferable that the driving unit includes a vertical driver circuit for simultaneously driving the transfer transistor and the reset transistor in a vertical direction, a noise suppressing circuit for obtaining a signal output to a plurality of vertical signal lines disposed in a vertical direction in the photosensitive region, and a horizontal driver circuit for outputting a signal from the noise suppressing circuit in a time series by successively switching a plurality of horizontal transistors disposed in a horizontal direction. It also is preferable that an impurity concentration of the floating diffusion layer is lower than an impurity concentration of a source/drain diffusion layer provided in a plurality of transistors constituting the vertical driver circuit and the horizontal driver circuit.

It is preferable that the source/drain diffusion layer provided in the plurality of transistors constituting the vertical driver circuit and the horizontal driver circuit is covered with a salicide layer.

It is preferable that the transfer transistor and the amplifier transistor are composed of an n-type MOS transistor.

It is preferable that the vertical driver circuit and the horizontal driver circuit are composed of a dynamic logic circuit.

It is preferable that an impurity concentration of a source/drain diffusion layer of a part of the plurality of transistors constituting the vertical driver circuit and the horizontal driver circuit is lower than an impurity concentration of a source/drain diffusion layer of another part of the plurality of transistors constituting the vertical driver circuit and the horizontal driver circuit.

It is preferable that a source/drain diffusion layer of a part of the plurality of transistors constituting the vertical driver circuit and the horizontal driver circuit is formed to be exposed on a surface of the semiconductor substrate, and a source/drain diffusion layer of another part of the plurality of transistors constituting the vertical driver circuit and the horizontal driver circuit is covered with a salicide layer.

It is preferable that an impurity concentration of the floating diffusion layer is $1 \times 10^{18}$ cm$^{-3}$ or less.

A method for producing the solid-state imaging apparatus according to the present embodiment includes forming a salicide blocking film so as to cover a floating diffusion layer and a photodiode, forming a source/drain diffusion layer of an amplifier transistor, and forming a salicide layer so as to cover the source/drain diffusion layer of the amplifier transistor. Therefore, the salicide layer is not formed on the surface of the floating diffusion layer. Thus, in the floating diffusion layer, a pn-junction opposite-direction leakage current is reduced. As a result, a solid-state imaging apparatus with small noise and high sensitivity can be obtained.

It is preferable that an impurity concentration of the floating diffusion layer is lower than an impurity concentration of the source/drain diffusion layer of the amplifier transistor.

A method for producing the solid-state imaging apparatus according to another embodiment includes forming a second salicide blocking film so as to cover a floating diffusion layer, and forming a salicide layer so as to cover a source/drain diffusion layer of an amplifier transistor. Therefore, the salicide layer is not formed on the surface of the floating diffusion layer. Thus, in the floating diffusion layer, a pn-junction opposite-direction leakage current is reduced. As a result, a solid-state imaging apparatus with small noise and high sensitivity can be obtained.

Hereinafter, the present invention will be described by way of illustrative embodiments with reference to the drawings.

FIG. 1 is a circuit diagram showing a configuration of a solid-state imaging apparatus 100 according to the present embodiment. Photosensitive cells 8 composed of photodiodes 5, transfer gates 6, amplifier transistors 2, and reset transistors 7 are arranged in a matrix (3 row×3 column).

Drains of the amplifier transistor 2 and the reset transistor 7 are connected to a common drain line 306. A source of the amplifier transistor 2 is connected to a vertical signal line 15, as shown in FIG. 1. One end of the vertical signal line 15 is connected to a load transistor 305, and the other end thereof is connected to a noise suppressing circuit 12. Outputs of the noise suppressing circuit 12 are connected to horizontal transistors 14 driven by a horizontal driver circuit 13. Each photosensitive cell 8 is driven by a vertical driver circuit 11.

Figure 2:
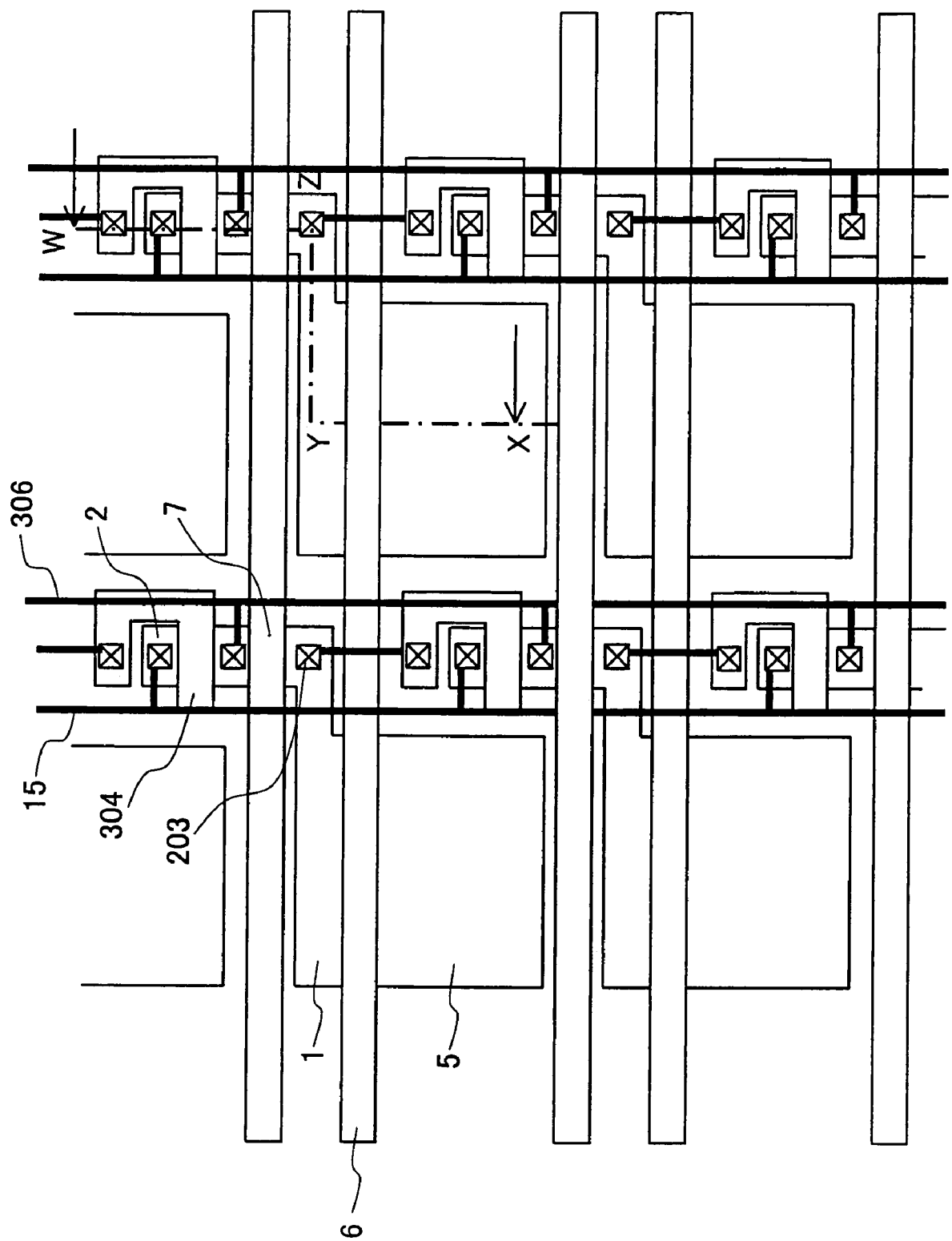
FIG. 2 is a plan view showing a configuration of main portions of the solid-state imaging apparatus according to the present embodiment.

FIG. 2 is plan view showing a configuration of the photosensitive cells 8 provided in the solid-state imaging apparatus 100. A signal of the photodiode 5 is read to a floating diffusion layer 1 through the transfer gate 6. The signal that has been subjected to voltage conversion in the floating diffusion layer 1 is applied from a floating diffusion layer contact 203 to a gate 304 of the amplifier transistor 2. A source/drain of the amplifier transistor 2 is connected to the common drain line 306 and the vertical signal line 15. Signal charge in the floating diffusion layer 1 is discharged to the common drain line 306 through the reset transistor 7.

Figure 3:
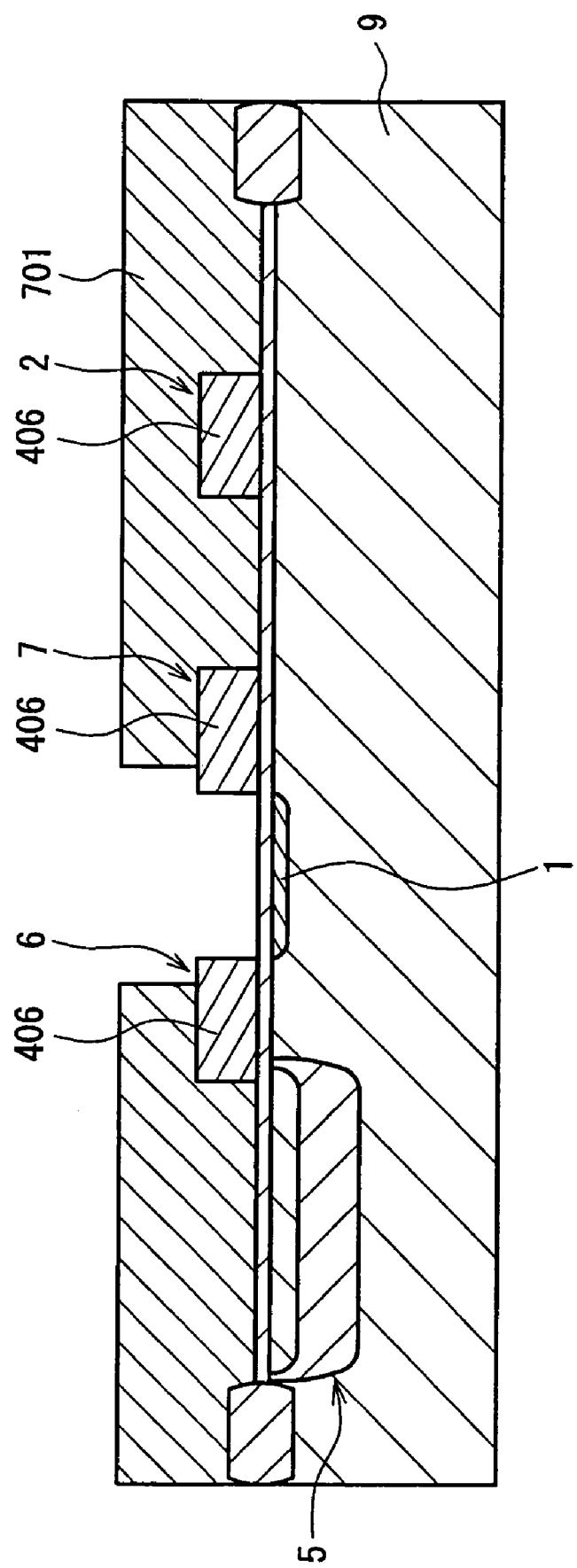
FIG. 3 is a cross-sectional view showing a method for producing a solid-state imaging apparatus according to the present embodiment.
Figure 4:
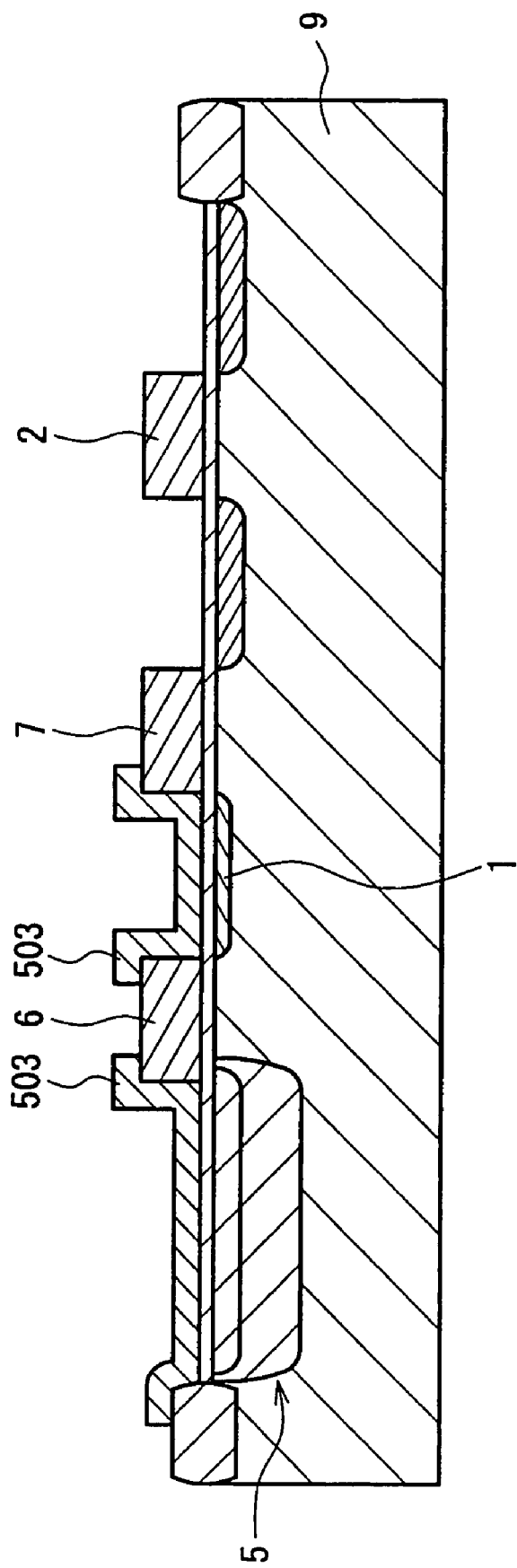
FIG. 4 is a cross-sectional view showing the method for producing a solid-state imaging apparatus according to the present embodiment.
Figure 5:
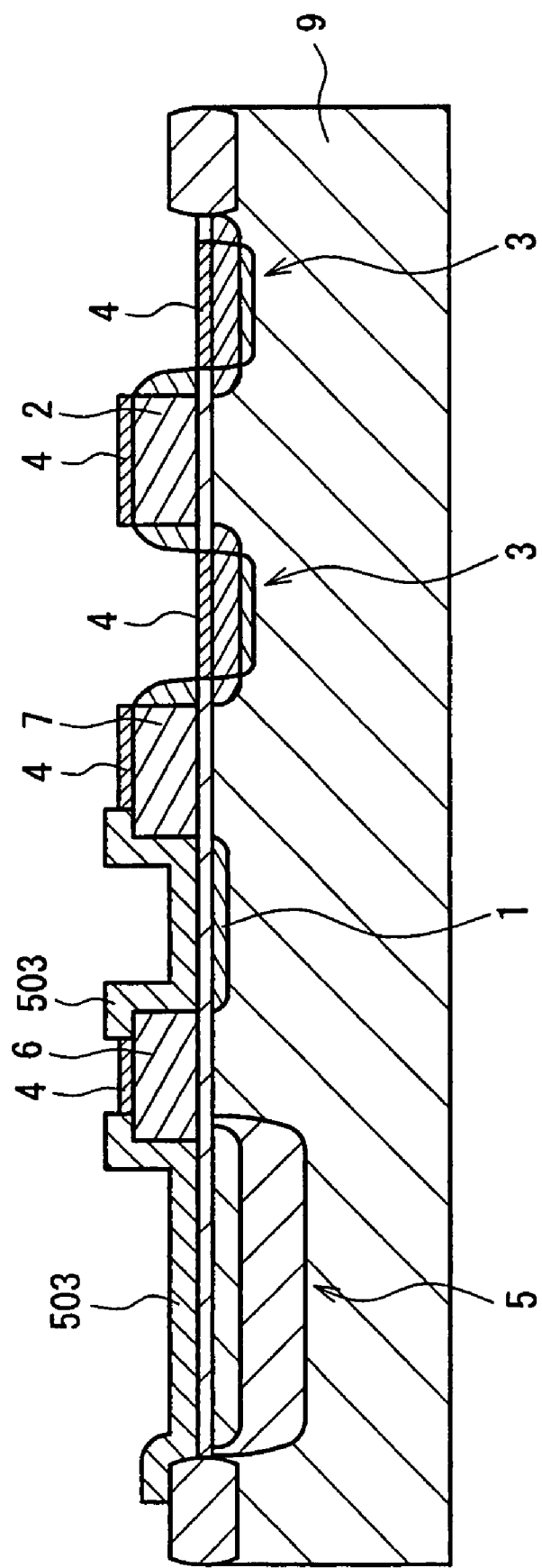
FIG. 5 is a cross-sectional view showing the method for producing a solid-state imaging apparatus according to the present embodiment.

FIGS. 3 to 5 are cross-sectional views showing a method for producing the solid-state imaging apparatus 100 according to the present embodiment. Referring to FIG. 3, a polysilicon layer 406 to be gate electrodes of MOS transistors constituting the transfer gate 6, the reset transistor 7, and the amplifier transistor 2 is formed. Thereafter, a resist 701 formed so as to open a portion to be a floating diffusion layer by photoetching is formed. Then, a low-concentration floating diffusion layer 1 is formed by ion implantation, using the resist 701 as a mask.

Thereafter, as shown in FIG. 4, a salicide blocking film 503 is formed so as to cover the photodiode 5 and the floating diffusion layer 1.

Then, as shown in FIG. 5, a source/drain layer 3 and a salicide layer 4 are formed by the same method as that of the above-mentioned prior art.

Figure 6:
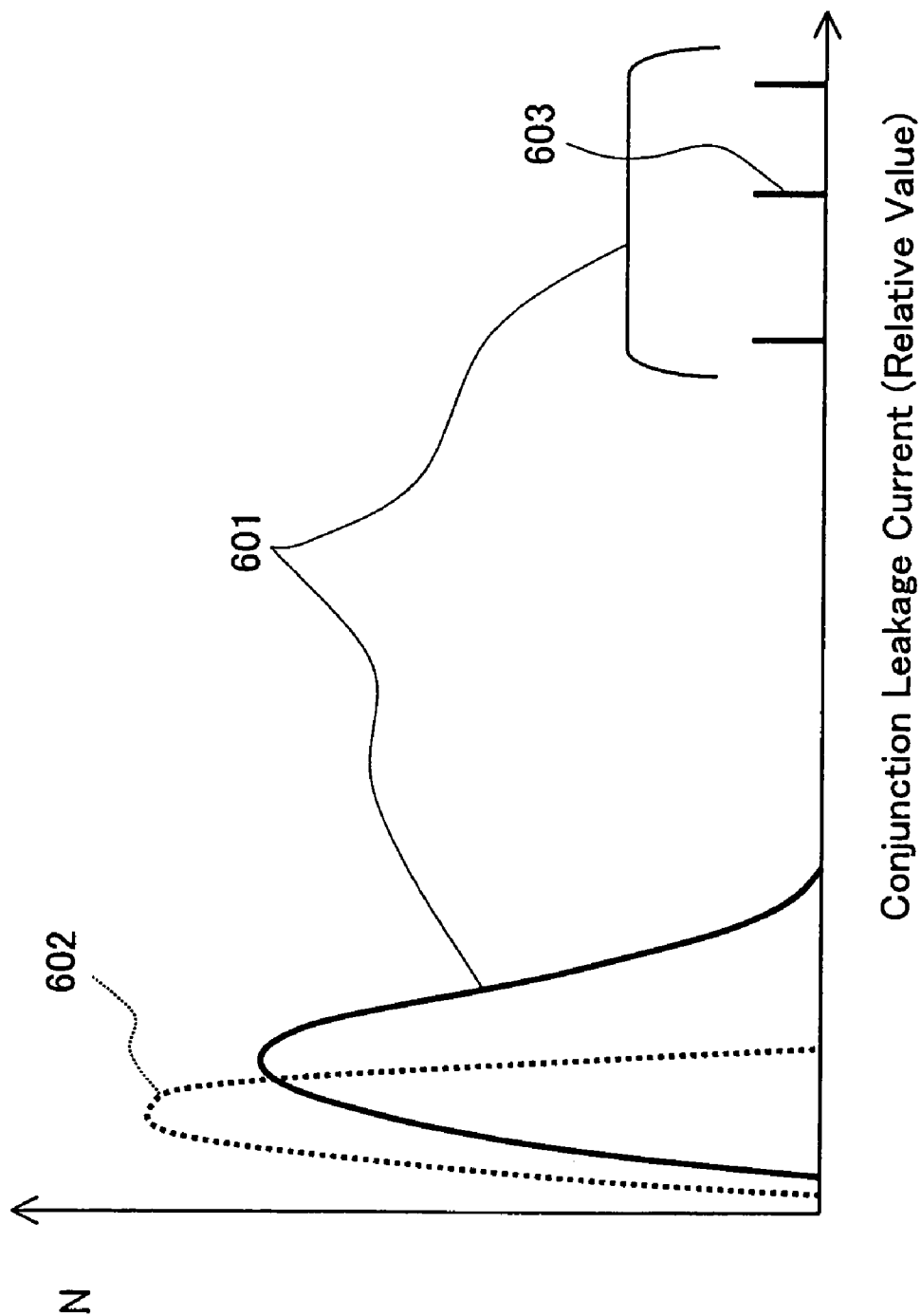
FIG. 6 is a graph showing the frequency of a conjunction leakage current in the solid-state imaging apparatus according to the present embodiment.

FIG. 6 is a graph showing the frequency of a conjunction leakage current in the solid-state imaging apparatus 100. A horizontal axis represents the magnitude of a conjunction leakage current, and a vertical axis represents the number of pn-junction floating diffusion layers representing the junction leakage current of the horizontal axis. A solid line 601 represents a distribution regarding the case where the salicide layer 4 is formed on the floating diffusion layer 1, and a dotted line 602 represents a distribution regarding the case where the salicide layer 4 is not formed on the floating diffusion layer 1. Compared with the case where the salicide layer 4 is not formed on the floating diffusion layer 4, the entire distribution is shifted to a larger conjunction leakage current in the case where the salicide layer 4 is formed on the floating diffusion layer 4. Furthermore, there is a distribution 603 in which a conjunction leakage current locally is very large. This leads to a point defect, resulting in a defective solid-state imaging apparatus.

Figure 7:
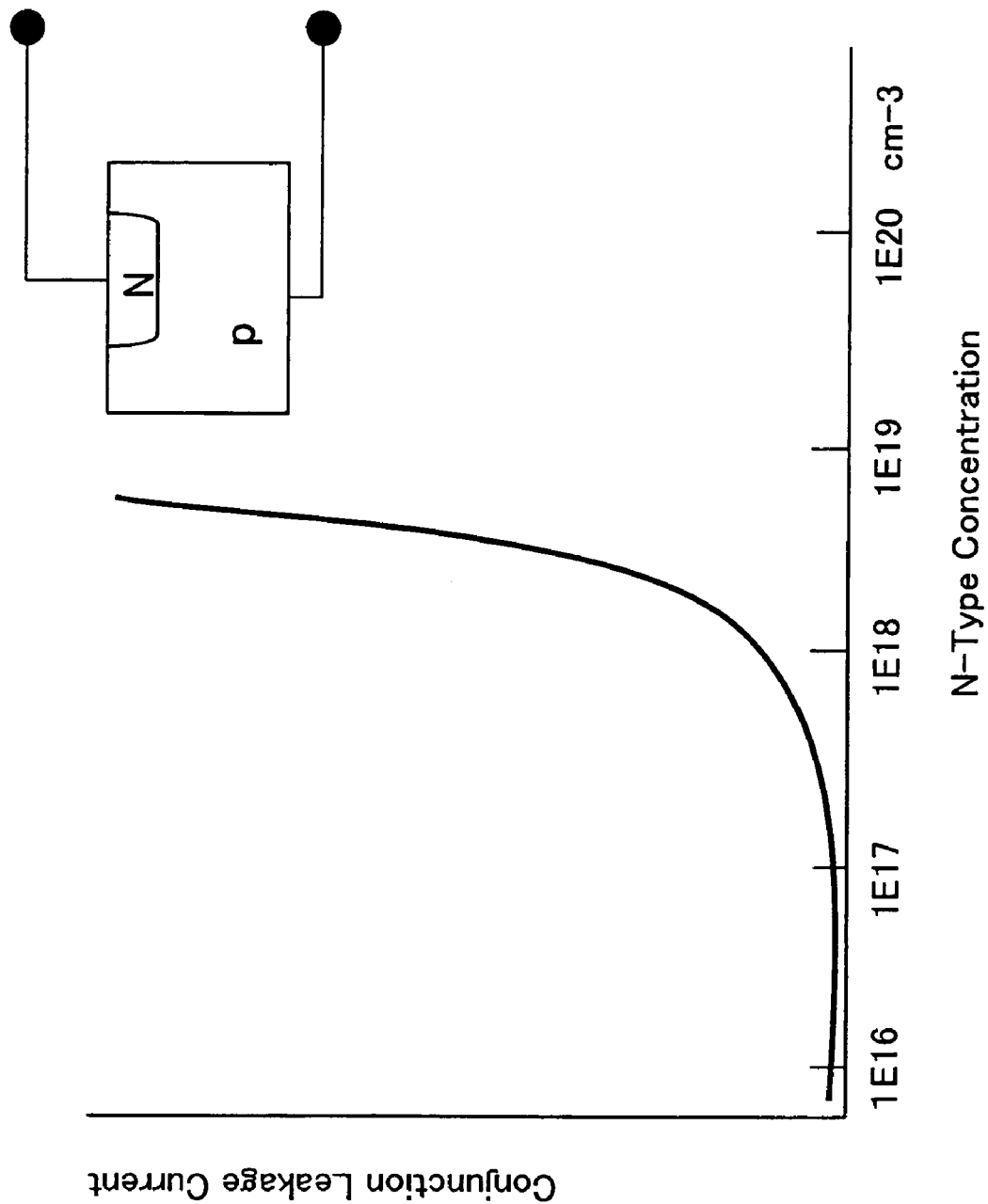
FIG. 7 is a graph showing a relationship between an impurity concentration of a floating diffusion layer and a conjunction leakage current in the solid-state imaging apparatus according to the present embodiment.

FIG. 7 is a graph showing a relationship between the impurity concentration and the conjunction leakage current of the floating diffusion layer 1 in the solid-state imaging apparatus 100. A horizontal axis represents the impurity concentration of the floating diffusion layer 1, and a vertical axis represents a conjunction leakage current. When the impurity concentration of the floating diffusion layer 1 reaches $1 \times 10^{18}$ cm$^{-3}$ or more, a conjunction leakage current is increased rapidly.

As described above, according to the present embodiment, the source/drain diffusion layer 3 provided in the amplifier transistor 2 is covered with the salicide layer 4, and the floating diffusion layer 1 is formed so as to be exposed on the surface of the semiconductor substrate 9. Therefore, the salicide layer 4 is not formed on the surface of the floating diffusion layer 1. Thus, a pn-junction opposite-direction leakage current is reduced in the floating diffusion layer 1. As a result, a solid-state imaging apparatus with small noise and high sensitivity can be obtained.

Figure 8:
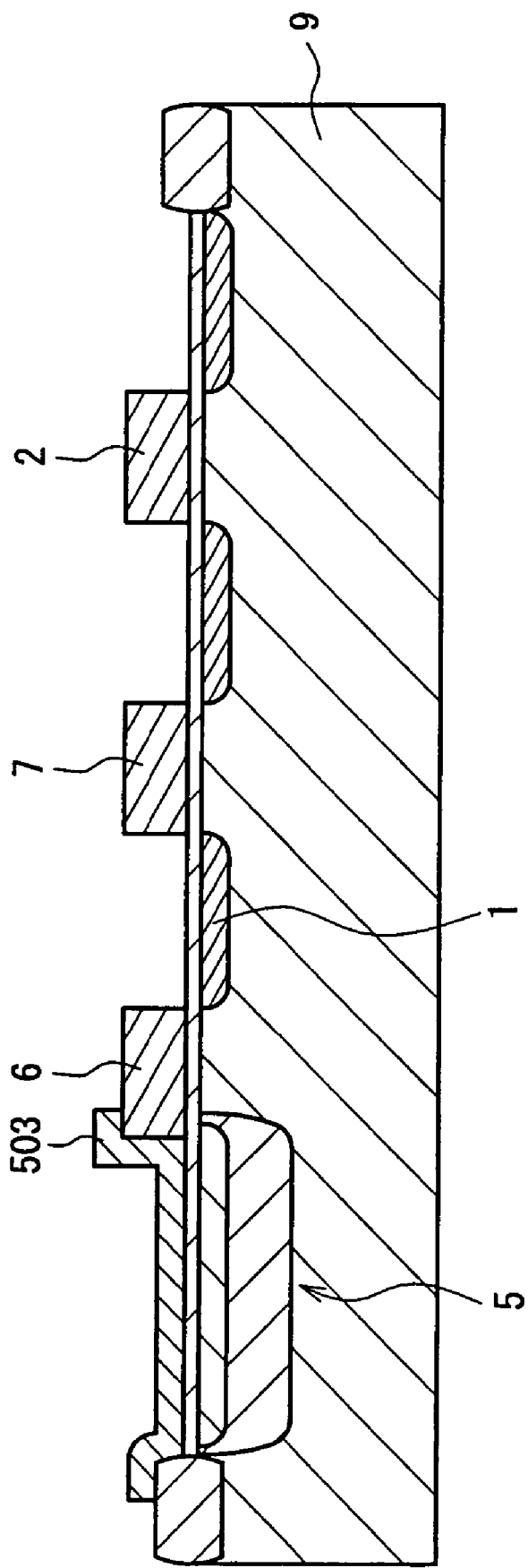
FIG. 8 is a cross-sectional view showing another method for producing a solid-state imaging apparatus according to the present embodiment.
Figure 9:
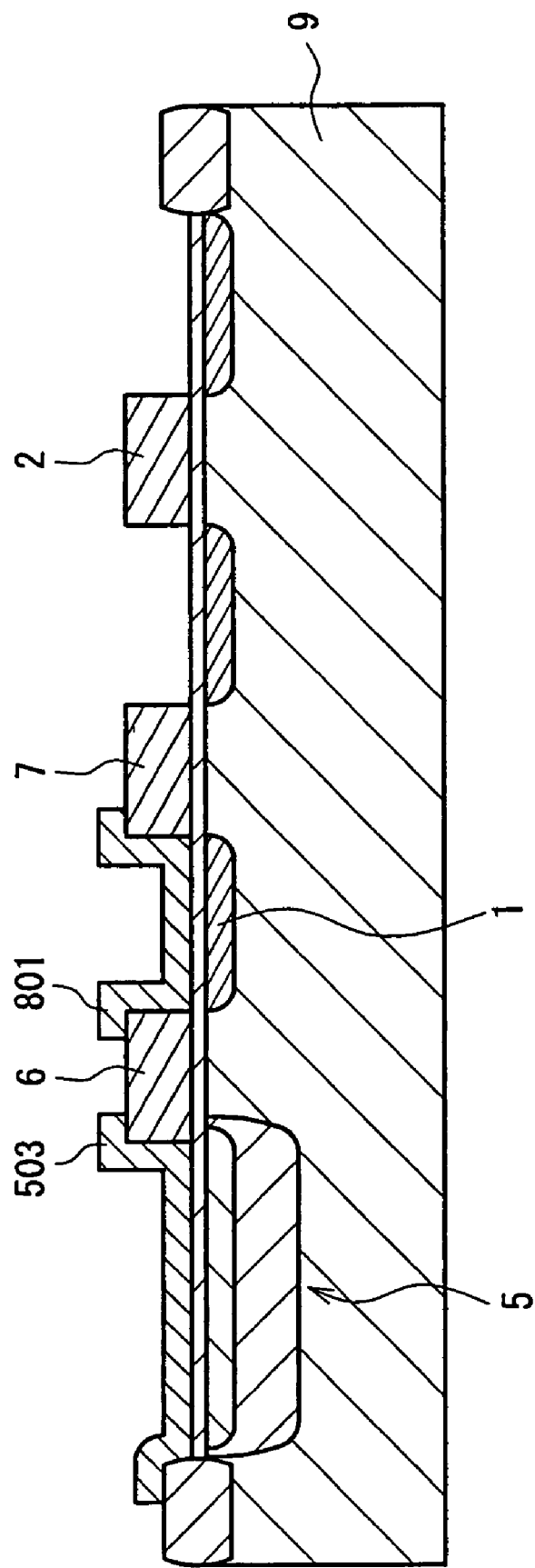
FIG. 9 is a cross-sectional view showing another method for producing a solid-state imaging apparatus according to the present embodiment.
Figure 10:
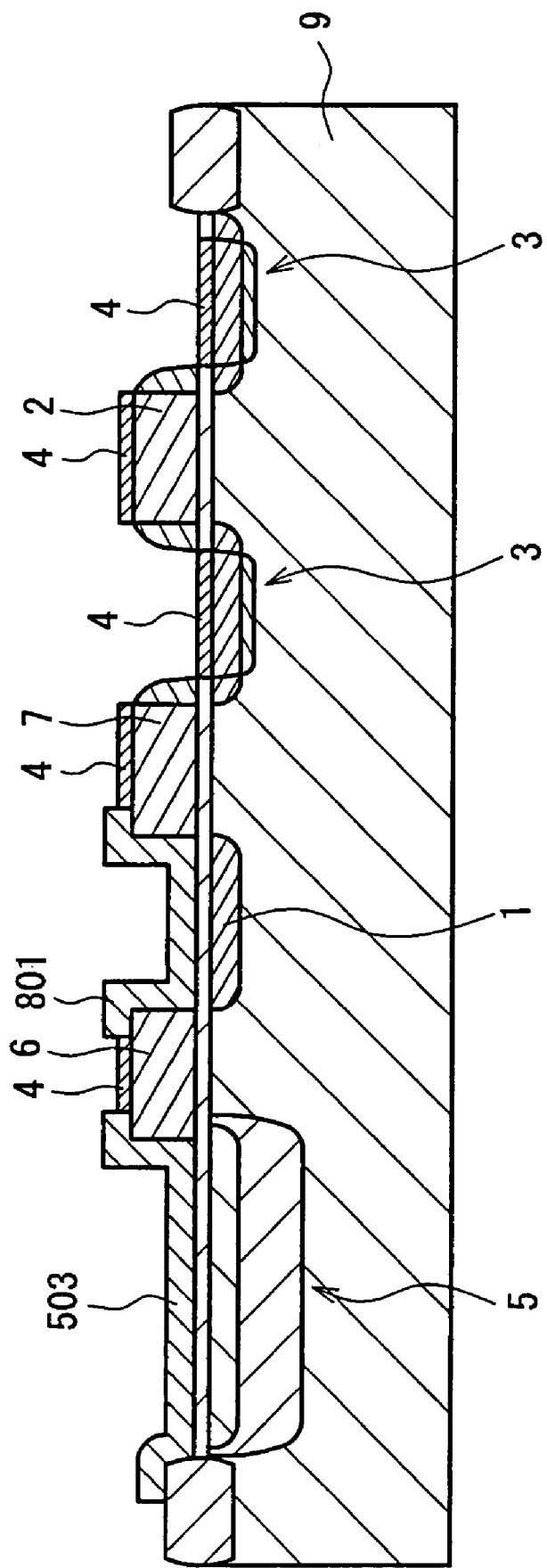
FIG. 10 is a cross-sectional view showing another method for producing a solid-state imaging apparatus according to the present embodiment.

FIGS. 8 to 10 are cross-sectional views showing another method for producing a solid-state imaging apparatus according to the present embodiment. The same components as those described with reference to FIGS. 3 to 5 are denoted with the same reference numerals as those therein. Thus, the detailed description of these components will be omitted here.

Referring to FIG. 8, an LDD diffusion layer is formed in the same way as in FIGS. 4 and 5 as described above. Referring to FIG. 9, a second salicide blocking film 801 is formed so as to cover a floating diffusion layer 1. Thereafter, as shown in FIG. 10, a source/drain layer 3 and a salicide layer 4 are formed in the same way as in the above prior art.

Figure 11:
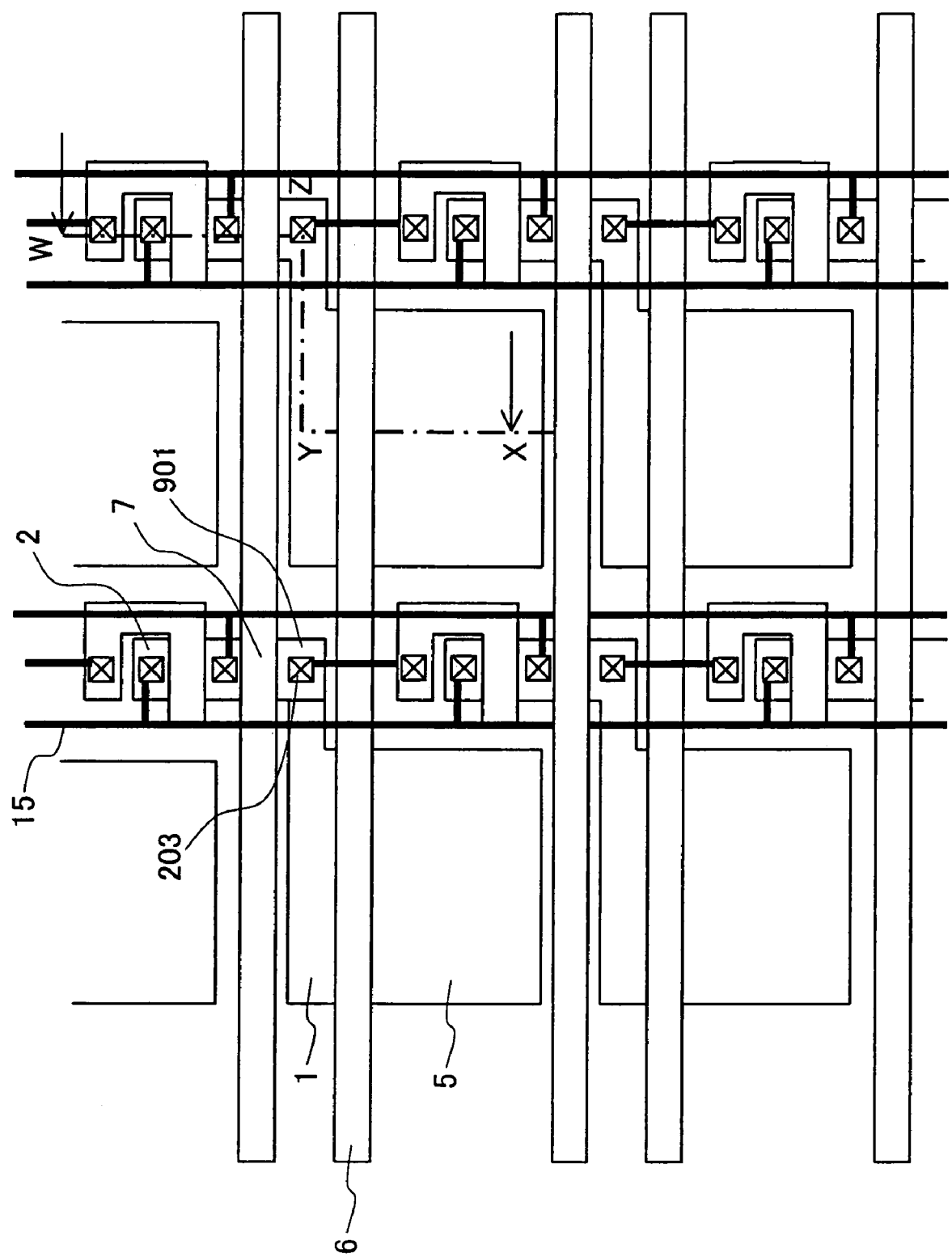
FIG. 11 is a plan view showing a configuration of main portions of another solid-state imaging apparatus according to the present embodiment.

FIG. 11 is a plan view showing a configuration of main portions of another solid-state imaging apparatus according to the present embodiment. The same components as those described with reference to FIG. 2 are denoted with the same reference numerals as those therein. Thus, the detailed description of the components will be omitted here.

In the floating diffusion layer 1, instead of decreasing the impurity concentration of a diffusion layer by removing a salicide layer over an entire region, the salicide layer may be removed in a partial region to decrease the impurity concentration of the diffusion layer. In FIG. 11, it is effective to decrease the concentration by removing the salicide layer in a region other than a periphery 901 of a contact portion 203 of the floating diffusion layer 1.

Figure 12:
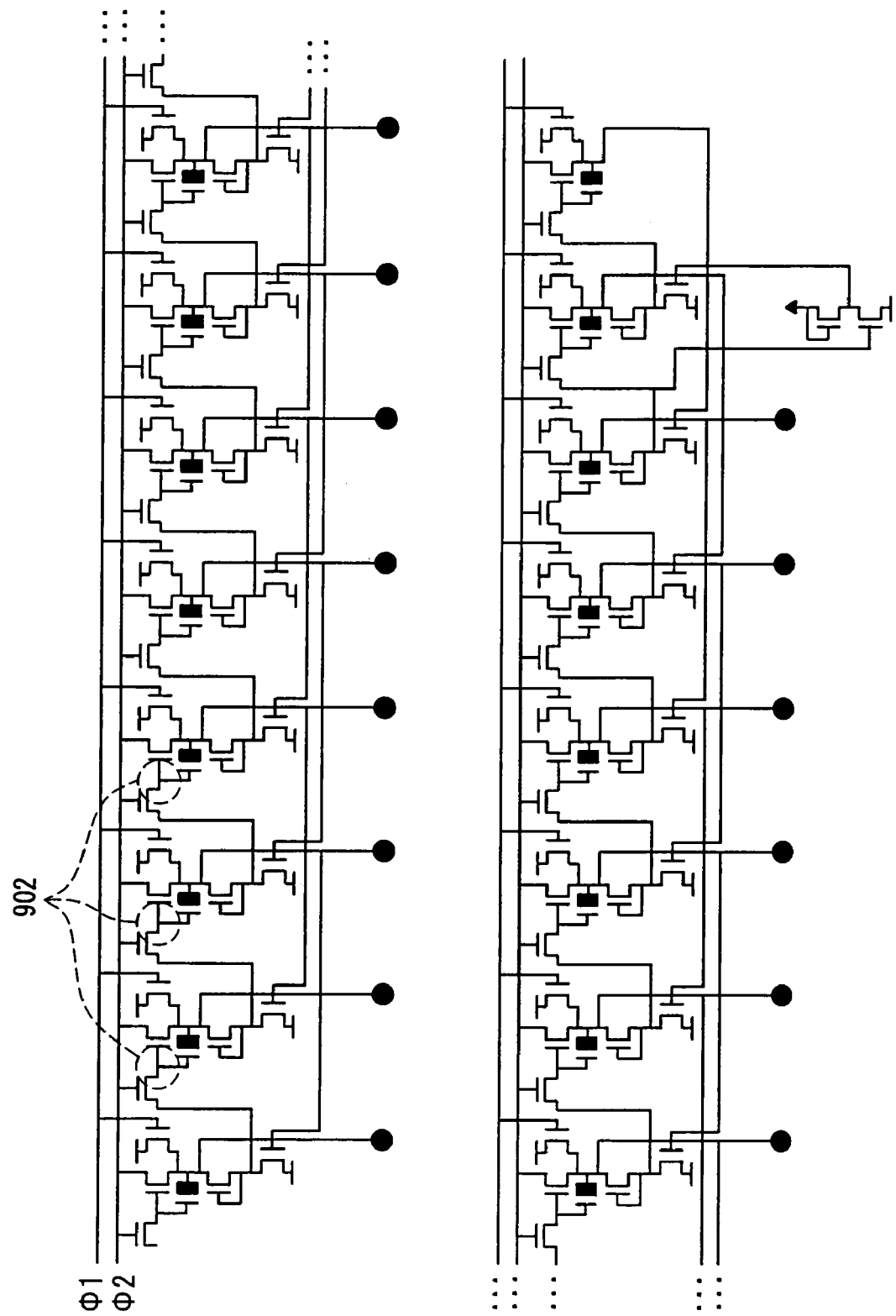
FIG. 12 is a circuit diagram showing a configuration of a dynamic logic circuit provided in the solid-state imaging apparatus according to the present embodiment.
Figure 13:
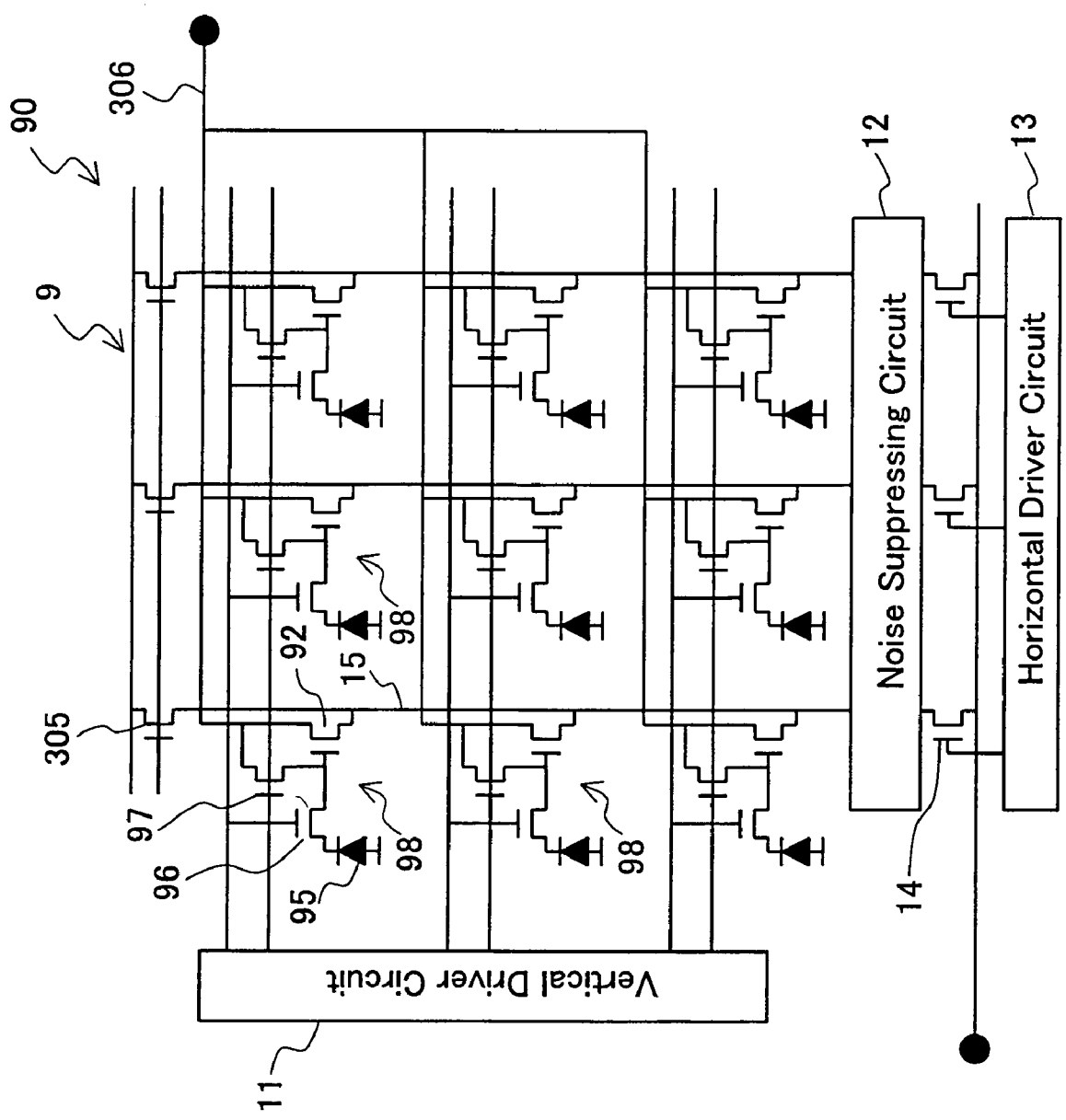
FIG. 13 is a circuit diagram showing a configuration of a conventional solid-state imaging apparatus.
Figure 14:
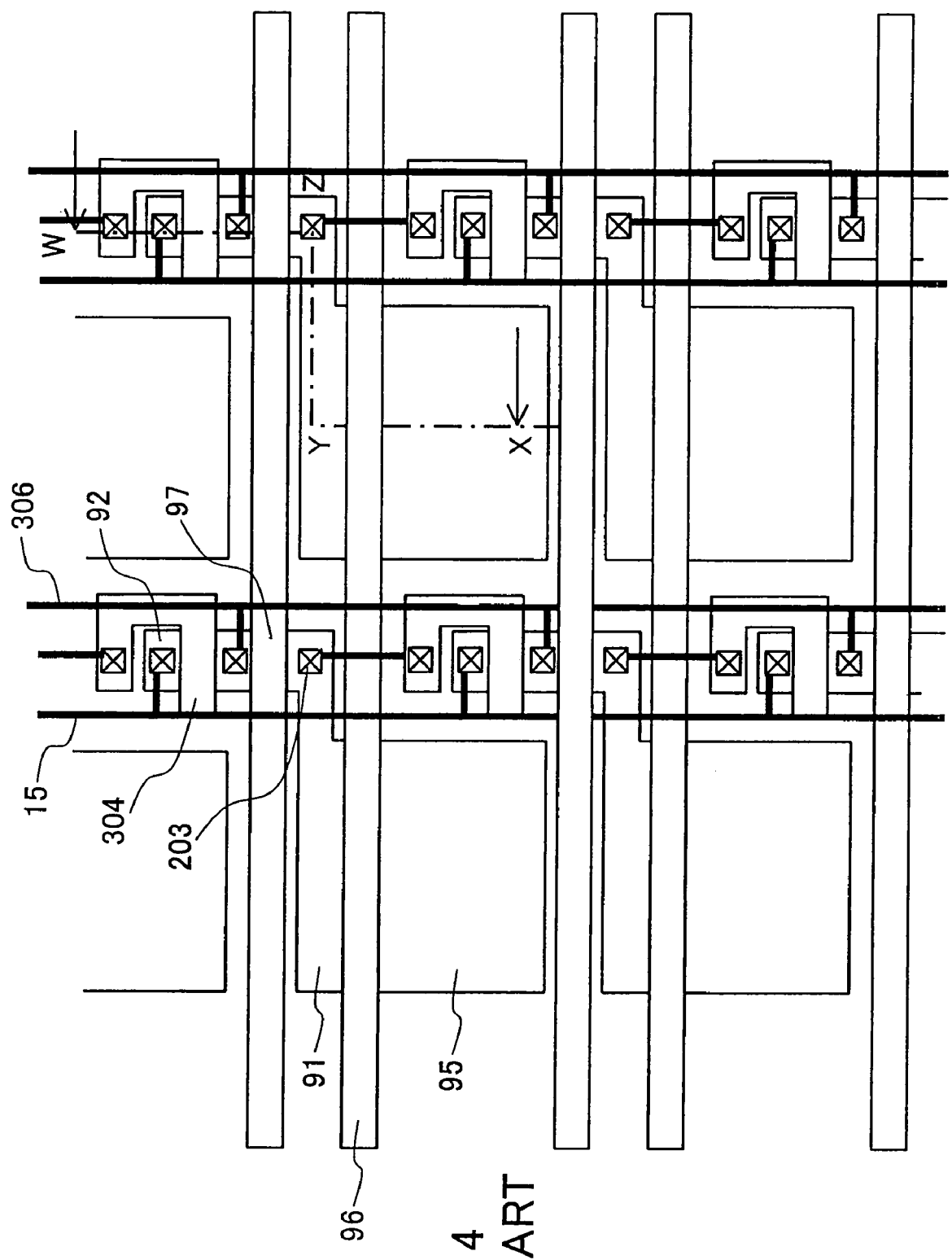
FIG. 14 is a plan view showing a configuration of main portions of the conventional solid-state imaging apparatus.
Figure 15:
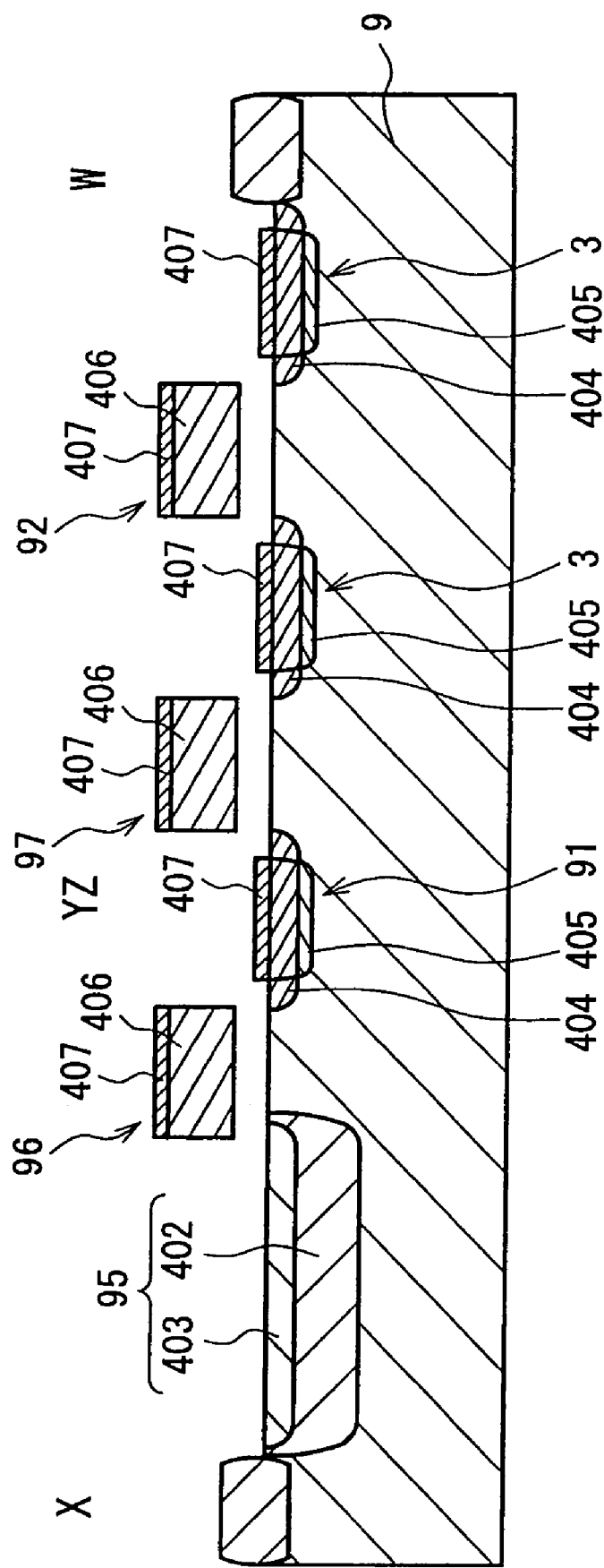
FIG. 15 is a cross-sectional view showing a configuration of the conventional solid-state imaging apparatus.
Figure 16:
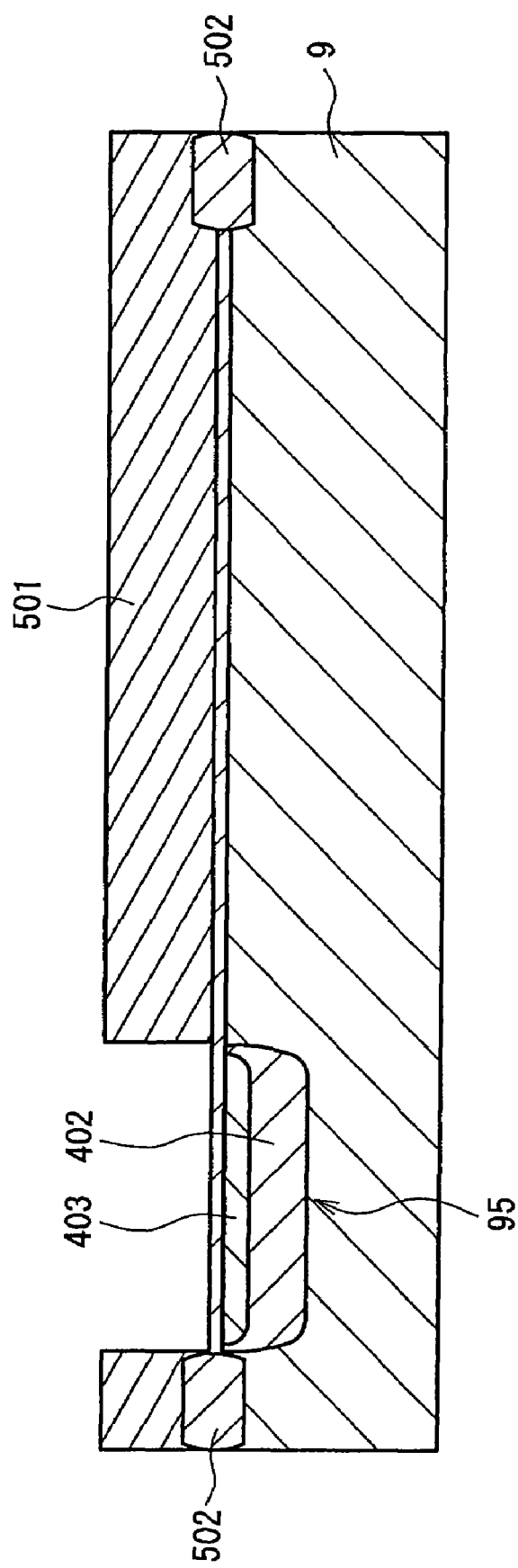
FIG. 16 is a cross-sectional view showing a conventional method for producing a solid-state imaging apparatus.
Figure 17:
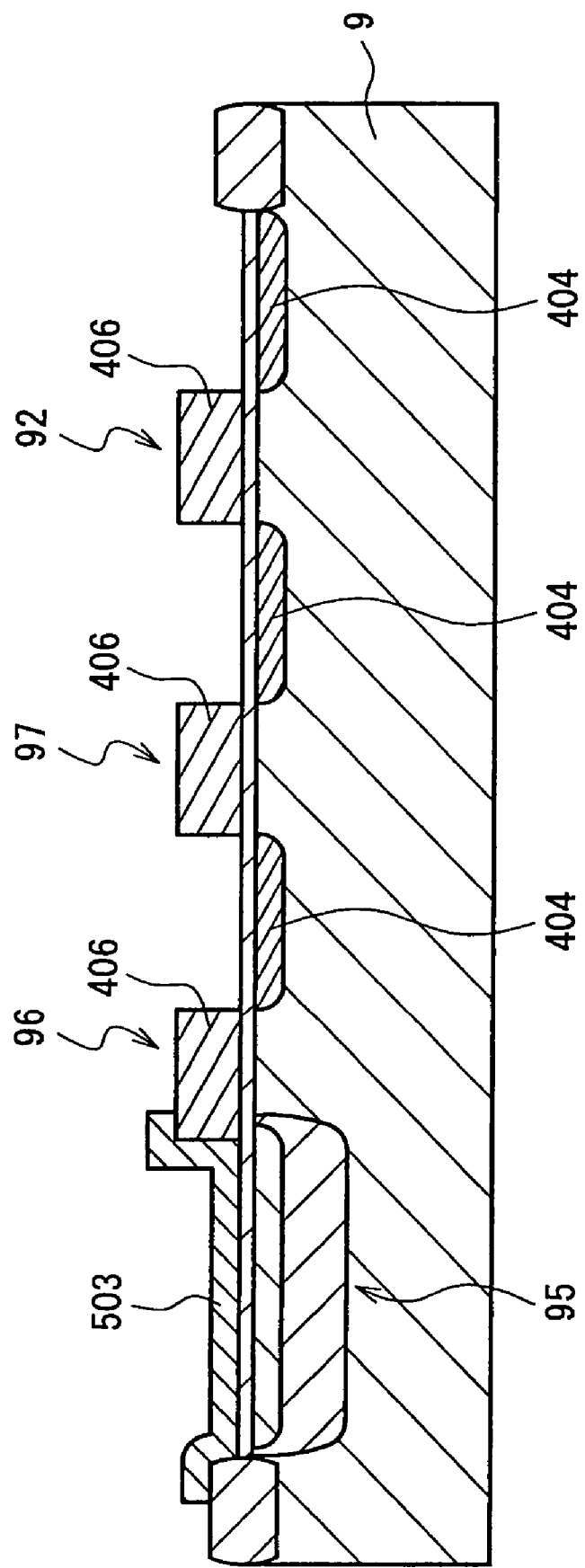
FIG. 17 is a cross-sectional view showing the conventional method for producing a solid-state imaging apparatus.
Figure 18:
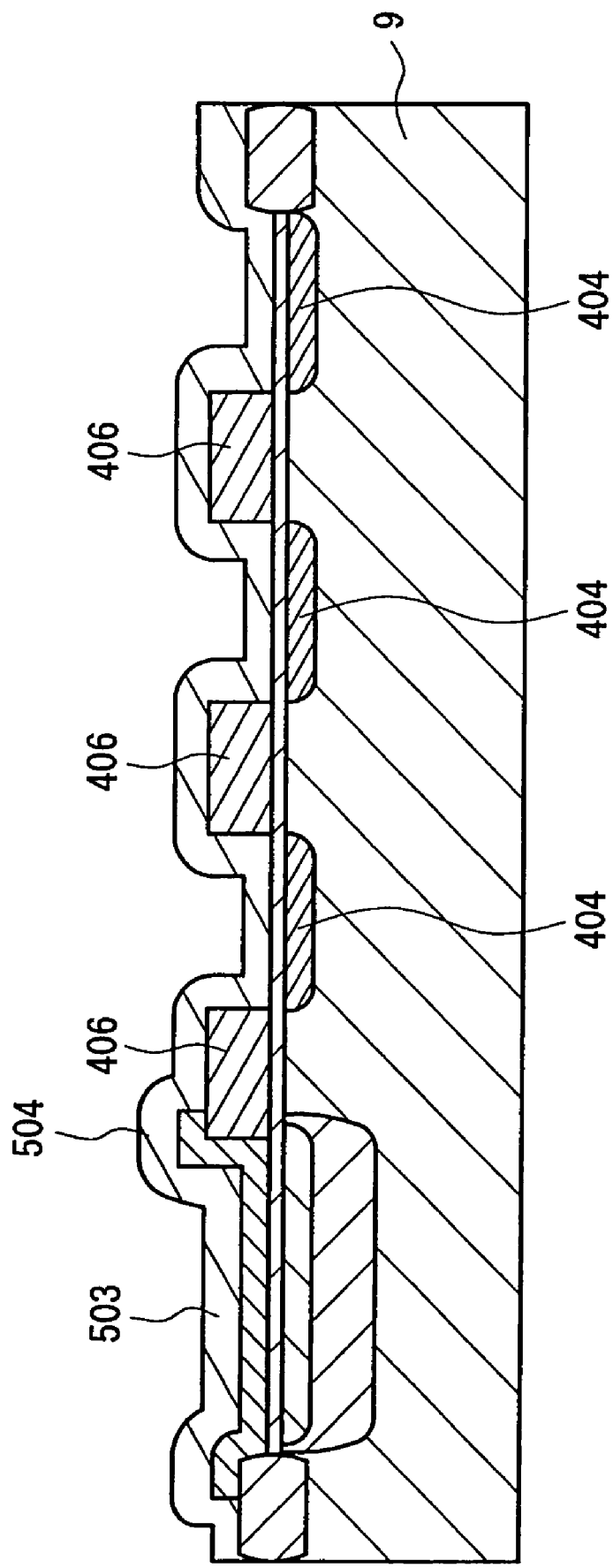
FIG. 18 is a cross-sectional view showing the conventional method for producing a solid-state imaging apparatus.
Figure 19:
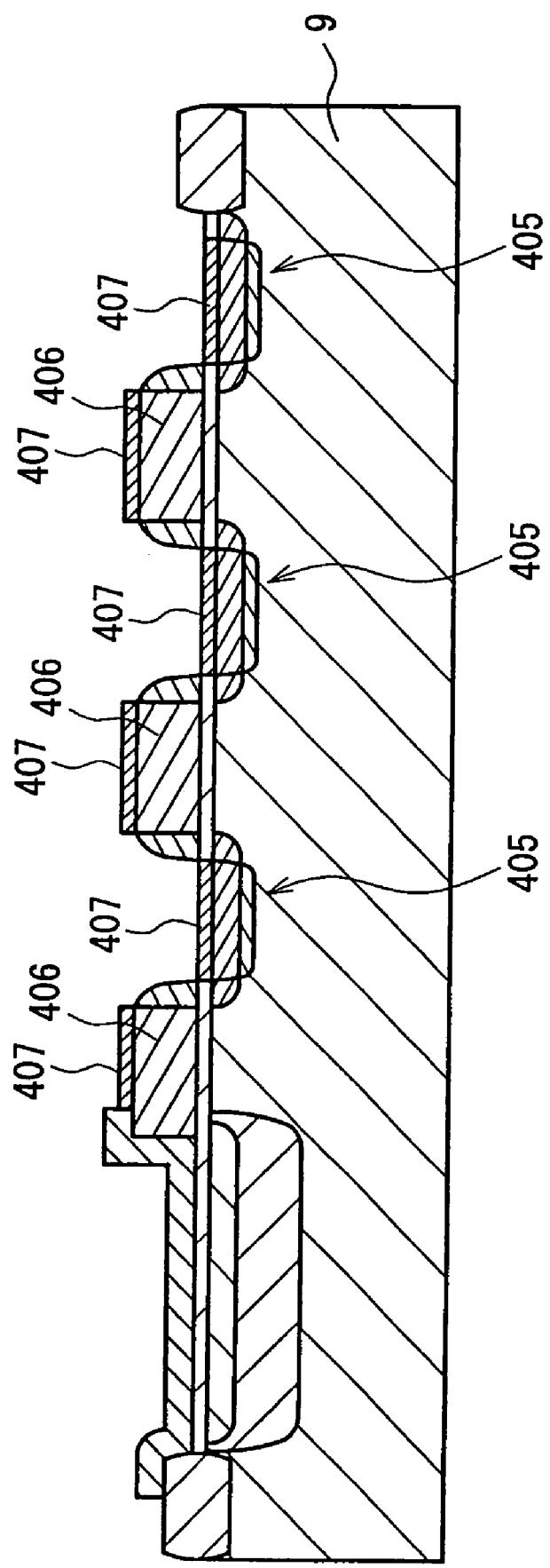
FIG. 19 is a cross-sectional view showing the conventional method for producing a solid-state imaging apparatus.

FIG. 12 is a circuit diagram showing a configuration of a dynamic logic circuit provided in the solid-state imaging apparatus according to the present embodiment. Recently, a CMOS logic has become mainstream of a semiconductor. Therefore, a MOS-type imaging apparatus often is configured using a CMOS logic. According to the CMOS logic, the steps are long and determined in view of miniaturization of a transistor, so that it is very difficult to change the steps due to a sensor.

Particularly, in the miniaturized steps, a p-channel transistor is difficult to form. The reason for this is as follows: the mass of boron, which is a p-type impurity, is relatively low and the atoms are likely to move, so that it is difficult to produce a miniaturized transistor using boron. Therefore, in order to perform production steps peculiar to a sensor, using a miniaturized transistor, it is advantageous to configure a transistor only with a NMOS.

When a circuit only with an NMOS is used, power consumption generally is increased compared with the case using a CMOS. Therefore, a dynamic logic circuit is used. The dynamic logic circuit performs an operation called booting for raising a voltage by the capacitance of a MOS. When a leakage current is increased, the MOS capacitance portion is not operated, either. This is exactly matched with the object of the present invention of decreasing a leakage current.

Particularly, in an imaging apparatus applied to a digital still camera, there is a mode (long-duration exposure) for a very slow operation. Therefore, even in the NMOS dynamic logic circuit, it is necessary to perform isolation of a low leakage current. FIG. 12 shows an example of a shift register circuit configured using a dynamic circuit. The description of the operation will be omitted here. When a leakage current of the MOS capacitance 902 is large, a slow operation cannot be performed. It is very effective to use isolation of the present invention for isolation of the MOS capacitance 902.

More specifically, when the solid-state imaging apparatus is miniaturized, in establishing a low leakage current technique intended to provide higher performance such as isolation, p-ch that makes it difficult to produce a miniaturized transistor is excluded to configure a transistor only with an N-chMOS, and to design a dynamic logic circuit for lower power consumption as in a CMOS, it is necessary to decrease a leakage current. A miniaturized transistor, a MOS only with n-channels, low leakage isolation, and a dynamic logic circuit are the shortest route for realizing a solid-state imaging apparatus with high performance.

As described above, according to the present embodiment, a solid-state imaging apparatus with small noise and high sensitivity and a method for producing the same can be provided.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for producing a solid-state imaging apparatus comprising:
   a plurality of photosensitive cells disposed in a matrix in a photosensitive region on a semiconductor substrate; and
   a driving unit for driving the plurality of photosensitive cells,
   wherein each of the photosensitive cells includes:
   a photodiode formed to be exposed on a surface of the semiconductor substrate, for accumulating signal charge obtained by subjecting incident light to photoelectric exchange;
   a transfer transistor formed on the semiconductor substrate, for transferring the signal charge accumulated in the photodiode;
   a floating diffusion layer formed on the semiconductor substrate, for temporarily accumulating the signal charge transferred by the transfer transistor; and
   an amplifier transistor formed on the semiconductor substrate, for amplifying the signal charge temporarily accumulated in the floating diffusion layer,
   wherein a source/drain diffusion layer provided in the amplifier transistor is covered with a salicide layer, and the floating diffusion layer is formed to be exposed on the surface of the semiconductor substrate,
   the method comprising:
   forming the photodiode, the transfer transistor, and the amplifier transistor on the semiconductor substrate;
   forming a resist in a predetermined pattern so as to cover the photodiode, the transfer transistor, and the amplifier transistor;
   implanting ions into the semiconductor substrate using the resist as a mask so as to form the floating diffusion layer;
   removing the resist and forming a salicide blocking film so as to cover the floating diffusion layer and the photodiode;
   forming a source/drain diffusion layer of the amplifier transistor; and
   forming a salicide layer so as to cover the source/drain diffusion layer of the amplifier transistor.

2. The method for producing the solid-state imaging apparatus according to claim 1, wherein an impurity concentration of the floating diffusion layer is lower than an impurity concentration of the source/drain diffusion layer of the amplifier transistor.

3. A method for producing a solid-state imaging apparatus comprising:
   a plurality of photosensitive cells disposed in a matrix in a photosensitive region on a semiconductor substrate; and
   a driving unit for driving the plurality of photosensitive cells,
   wherein each of the photosensitive cells includes:
   a photodiode formed to be exposed on a surface of the semiconductor substrate, for accumulating signal charge obtained by subjecting incident light to photoelectric exchange;
   a transfer transistor formed on the semiconductor substrate, for transferring the signal charge accumulated in the photodiode;
   a floating diffusion layer formed on the semiconductor substrate, for temporarily accumulating the signal charge transferred by the transfer transistor; and
   an amplifier transistor formed on the semiconductor substrate, for amplifying the signal charge temporarily accumulated in the floating diffusion layer,
   wherein a source/drain diffusion layer provided in the amplifier transistor is covered with a salicide layer, and the floating diffusion layer is formed to be exposed on the surface of the semiconductor substrate,
   the method comprising:
   forming a resist in a predetermined pattern on the semiconductor substrate;

implanting ions using the resist as a mask so as to form the photodiode;

removing the resist and forming the transfer transistor and the amplifier transistor on the semiconductor substrate;

forming a first salicide blocking film so as to cover the photodiode;

implanting ions into the semiconductor substrate so as to form the floating diffusion layer and the source/drain diffusion layer of the amplifier transistor;

forming a second salicide blocking film so as to cover the floating diffusion layer; and forming a salicide layer so as to cover the source/drain diffusion layer of the amplifier transistor.

4. The method for producing the solid-state imaging apparatus according to claim 3, wherein an impurity concentration of the floating diffusion layer is lower than an impurity concentration of the source/drain diffusion layer of the amplifier transistor.

5. A method for producing a solid-state imaging apparatus comprising:

a plurality of photosensitive cells disposed in a matrix in a photosensitive region on a semiconductor substrate; and a driving unit for driving the plurality of photosensitive cells, wherein each of the photosensitive cells include:

a photodiode formed to be exposed on a surface of the semiconductor substrate, for accumulating signal charge obtained by subjecting incident light to photoelectric exchange;

a transfer transistor formed on the semiconductor substrate, for transferring the signal charge accumulated in the photodiode;

a floating diffusion layer formed on the semiconductor substrate, for temporarily accumulating the signal charge transferred by the transfer transistor;

an amplifier transistor formed on the semiconductor substrate, for amplifying the signal charge temporarily accumulated in the floating diffusion layer; and a plurality of transistors constituting a horizontal driver circuit and a vertical driver circuit, wherein a source/drain diffusion layer provided in the transistors of the driver circuits are covered with a salicide layer, and the floating diffusion layer is formed to be exposed on the surface of the semiconductor substrate, the method comprising:

forming the photodiode, the transfer transistor, the amplifier transistor, and the transistors of the driver circuits on the semiconductor substrate;

forming a resist in a predetermined pattern so as to cover the photodiode, the transfer transistor, the amplifier transistor, and the transistors of the driver circuits;

implanting ions into the semiconductor substrate using the resist as a mask so as to form the floating diffusion layer;

removing the resist and forming a salicide blocking film so as to cover the floating diffusion layer and the photodiode;

forming a source/drain diffusion layer of the amplifier transistor; and forming a salicide layer so as to cover the source/drain diffusion layer of the transistors of the driver circuit.

6. The method for producing the solid-state imaging apparatus according to claim 5, wherein an impurity concentration of the floating diffusion layer is lower than an impurity concentration of the source/drain diffusion layer of the transistors of the driver circuits.

* * * * *